United States Patent
Richter

(10) Patent No.: US 8,549,835 B2
(45) Date of Patent: Oct. 8, 2013

(54) EXHAUST GAS SYSTEM FOR AN INTERNAL COMBUSTION ENGINE

(75) Inventor: Rainer Richter, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 320 days.

(21) Appl. No.: 12/944,795

(22) Filed: Nov. 12, 2010

(65) Prior Publication Data

US 2011/0113767 A1 May 19, 2011

Related U.S. Application Data

(63) Continuation of application No. PCT/EP2009/002885, filed on Apr. 21, 2009.

(30) Foreign Application Priority Data

May 15, 2008 (DE) .......................... 10 2008 023 831

(51) Int. Cl.
*F01N 3/00* (2006.01)

(52) U.S. Cl.
USPC ................ 60/275; 60/273; 60/298; 60/320; 136/205; 136/210; 136/211

(58) Field of Classification Search
USPC .................................................. 60/274–324
See application file for complete search history.

(56) References Cited

U.S. PATENT DOCUMENTS

| | | | |
|---|---|---|---|
| 3,734,293 A * | 5/1973 | Biskis ............................ 210/185 |
| 5,453,112 A * | 9/1995 | Sinicropi et al. .................. 95/41 |
| 6,598,405 B2 * | 7/2003 | Bell ................................. 62/3.3 |
| 7,100,369 B2 * | 9/2006 | Yamaguchi et al. ............ 60/324 |
| 7,638,705 B2 * | 12/2009 | Venkatasubramanian .... 136/206 |
| 2004/0134200 A1 * | 7/2004 | Schroeder et al. ............... 62/3.7 |
| 2005/0172993 A1 * | 8/2005 | Shimoji et al. ................ 136/208 |
| 2006/0124165 A1 * | 6/2006 | Bierschenk et al. .......... 136/212 |
| 2007/0193617 A1 * | 8/2007 | Taguchi ........................ 136/204 |
| 2007/0272292 A1 * | 11/2007 | Tsai .............................. 136/204 |

(Continued)

FOREIGN PATENT DOCUMENTS

| | | |
|---|---|---|
| EP | 1 475 532 A2 | 11/2004 |
| EP | 1 522 685 A1 | 4/2005 |

(Continued)

OTHER PUBLICATIONS www.pacontrol.com; "Heat Transfer and Heat Exchangers"; Jul. 7, 2006.*

(Continued)

*Primary Examiner* — Thomas Denion
*Assistant Examiner* — Jesse Bogue
(74) *Attorney, Agent, or Firm* — Crowell & Moring LLP

(57) ABSTRACT

An exhaust gas system for an internal combustion engine has a thermoelectric power generator with a hot side and a cold side. The hot side is arranged on the exhaust gas system and is heatable by exhaust gas of the internal combustion engine. A first heat exchanger having a first thermal conductivity is arranged between the hot side and the exhaust gas flow. At least a second thermoelectric power generator is arranged on the exhaust gas system and has a second heat exchanger with a thermal conductivity that is different from the first thermal conductivity. The arrangement of thermoelectric power generators can generate electric power over a significantly wider operating point range of the internal combustion engine.

9 Claims, 2 Drawing Sheets

(56) References Cited

U.S. PATENT DOCUMENTS

| | | |
|---|---|---|
| 2008/0173537 A1 | 7/2008 | DeSteese et al. |
| 2009/0000310 A1* | 1/2009 | Bell et al. ............. 62/3.7 |
| 2010/0006132 A1* | 1/2010 | Hodes ................. 136/224 |
| 2010/0024859 A1* | 2/2010 | Bell et al. ............. 136/201 |
| 2010/0236595 A1* | 9/2010 | Bell et al. ............. 136/205 |

FOREIGN PATENT DOCUMENTS

| | | |
|---|---|---|
| JP | 6-81639 A | 3/1994 |
| JP | 7-12009 A | 1/1995 |
| JP | 2004-360522 A | 12/2004 |
| JP | 2006-34046 A | 2/2006 |
| JP | 2008-104317 A | 5/2008 |

OTHER PUBLICATIONS

International Search Report dated Jun. 26, 2009 with English translation (six (6) pages).

German Search Report dated Apr. 28, 2009 with Partial English translation (nine (9) pages).

* cited by examiner

EXHAUST GAS SYSTEM FOR AN INTERNAL COMBUSTION ENGINE

CROSS-REFERENCE TO RELATED APPLICATIONS

This application is a continuation of PCT International Application No. PCT/EP2009/002885, filed Apr. 21, 2009, which claims priority under 35 U.S.C. §119 from German Patent Application No. DE 10 2008 023 831.7, filed May 15, 2008, the entire disclosures of which are herein expressly incorporated by reference.

This application contains subject matter related to U.S. application Ser. No. 12/944,832, entitled "Cooling System for a Thermoelectric Power Generator (TEG)" filed on even date herewith.

BACKGROUND AND SUMMARY OF THE INVENTION

The invention relates to an exhaust gas system for an internal combustion engine having a thermoelectric power generator with a hot side and a cold side, the hot side being arranged on the exhaust gas system and being heatable by the exhaust gas of the internal combustion engine. A first heat exchanger having a first thermal conductivity is arranged between the hot side and the exhaust gas flow.

The relevant prior art includes, for example, published European patent application EP 1 475 532 A2, which discloses an internal combustion engine having an intake system and an exhaust gas system. The exhaust gas system and the intake system are connected together in a gas-conveying manner by way of an exhaust gas recirculation device. The exhaust gas recirculation device has a thermoelectric power generator, in order to recover electric power from the thermal energy of the exhaust gas. In order to guarantee an optimal supply of heat to the thermoelectric power generator by means of the exhaust gas recirculation line, valves are arranged in the exhaust gas recirculation line upstream and downstream of the thermoelectric power generator. These valves are actuated by a control unit as a function of the operating point. In order to obtain an optimal temperature differential between the hot side and the cold side of the thermoelectric power generator, the cold side of the thermoelectric power generator is connected to a coolant circuit.

Furthermore, it is known from published Japanese patent application JP 7012009 A2, on which this invention is based, to arrange the thermoelectric power generators on the exhaust gas system of an internal combustion engine. In this case, the exhaust gas line is divided into a plurality of parallel branches that convey the exhaust gas. Each of these branches has two thermoelectric power generators, as a result of which an optimal electric power generation under minimum exhaust gas back pressure conditions can be achieved. Furthermore, this branched exhaust gas system makes it possible to significantly reduce the amount of design space.

The drawback with the prior art arrangement of thermoelectric power generators is the relatively narrow speed or, more particularly, the load range of the internal combustion engine, in which the thermoelectric power generators optimally function, because the efficiency is very highly dependent on the temperature of the exhaust gas. Moreover, there is the risk of overheating if the internal combustion engine is operated in a high speed (load range) for a prolonged period of time.

An object of the present invention is to avoid the above-described drawbacks and to improve the efficiency of the electric power generation with thermoelectric power generators.

This and other objects are achieved with an exhaust gas system that is intended for an internal combustion engine and that includes a thermoelectric power generator with a hot side and a cold side, the hot side being arranged on the exhaust gas system and being heatable by the exhaust gas of the internal combustion engine. A first heat exchanger having a first thermal conductivity is arranged between the hot side and the exhaust gas flow. At least a second thermoelectric power generator is arranged on the exhaust gas system and includes a second heat exchanger having a thermal conductivity that is different from the first thermal conductivity.

In the simplest embodiment, the thermoelectric power generator having the heat exchanger with the lower thermal conductivity is arranged in close proximity to the internal combustion engine, and the second thermoelectric power generator having a heat exchanger with the higher thermal conductivity is arranged away from the internal combustion engine. This measure prevents the first thermoelectric power generator from being destroyed by overheating with an exhaust gas that is too hot. At the same time, the second thermoelectric power generator, including the heat exchanger that has the higher thermal conductivity and is operatively connected to the colder exhaust gas that has already been cooled, exhibits a higher efficiency at lower temperatures owing to the strategy according to the invention.

Preferably, in one embodiment, the exhaust gas system is characterized in that the exhaust gas system has at least a first and a second bypass, which are arranged one after the other in the direction of flow of an exhaust gas, the first thermoelectric power generator being arranged in the first bypass in the direction of flow of the exhaust gas, and the second thermoelectric power generator being arranged in the second bypass, and wherein a closure element for the exhaust gas is provided in at least one bypass.

Preferably, in the exhaust gas system, the first thermoelectric power generator has the heat exchanger with the lower thermal conductivity, and the second thermoelectric power generator has the heat exchanger with the higher thermal conductivity. This makes it possible to achieve a very good efficiency in the course of generating electric power.

In a second especially preferred design variant, the first and the second thermoelectric power generators are arranged in parallel to each other in the bypass, and wherein each thermoelectric power generator is heatable by the exhaust gas, at least one closure element for the exhaust gas being assigned to at least one thermoelectric power generator.

In another embodiment that makes it possible for the second especially preferred design variant to achieve a very good efficiency in the course of generating electric power, the exhaust gas of the internal combustion engine exhibits a colder or hotter temperature that is a function of an operating point. At least one closure element can be switched in such a way that hotter exhaust gas can be conveyed to the thermoelectric power generator having the heat exchanger with the lower thermal conductivity.

The use of a control unit is especially preferred. If the control unit is a control unit of the internal combustion engine, then this control unit also allows the characteristic parameters to be controlled in an advantageous manner.

In yet another embodiment that achieves an optimal temperature gradient between the hot side and the cold side of the thermoelectric power generator, the cold side of the thermoelectric power generator is integrated into a coolant circuit.

In an embodiment that achieves a very fast temperature rise of the thermoelectric power generators, the exhaust gas system has an additional closure element, wherein the additional closure element can be controlled in such a manner that all of the exhaust gas flows through the bypass.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
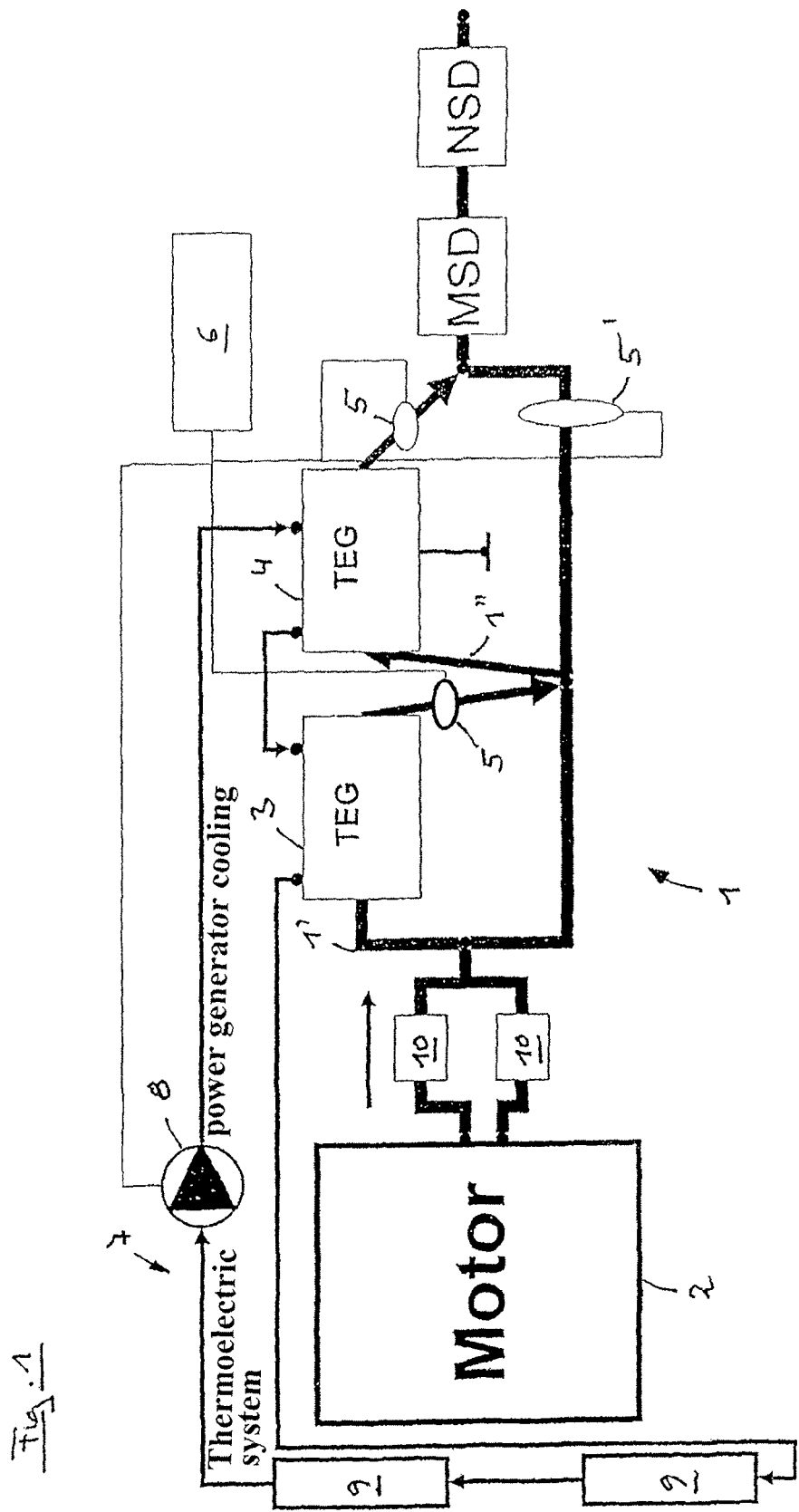
FIG. 1 is a schematic diagram of a first inventive embodiment for an exhaust gas system for an internal combustion engine.

In the following, the same reference numerals apply to the same components in both figures.

The term thermoelectric power generator (TEG) is defined hereinafter as a semiconductor component, which generates electric power at a temperature differential between a hot side and a cold side. Since thermoelectric power generators are already sufficiently well-known from the prior art, they are not explained in detail in the present application. Moreover, the term thermoelectric power generator may be defined as a single semiconductor component or as an interconnection of several individual semiconductor components so as to form a packet.

FIG. 1 is a schematic diagram of a first embodiment of an inventive exhaust gas system 1 for an internal combustion engine 2. An initially dual pipe exhaust gas system 1 is arranged on the internal combustion engine 2, each pipe being assigned an exhaust gas purification system 10. In the direction of flow of an exhaust gas of the internal combustion engine 2, downstream of the exhaust gas purification systems 10, the exhaust gas system 1 is designed as a single pipe. Then, the exhaust gas system has a first bypass 1', in which a first thermoelectric power generator 3 is arranged. Downstream of the first thermoelectric power generator 3, a closure element 5 is arranged in the bypass 1'. Downstream of the closure element 5, the first bypass 1' empties again in a gas-conveying manner into the exhaust gas system 1. Then, the exhaust gas system 1 has a second bypass 1", in which a second thermoelectric power generator 4 is arranged. Downstream of the second thermoelectric power generator 4, a closure element 5 is also arranged in the second bypass, before the second bypass 1" empties again in a gas-conveying manner into the exhaust gas system 1. Then in the direction of flow of the exhaust gas, first a central muffler (MSD) and then a rear muffler (NSD) are arranged in the exhaust gas system 1. Furthermore, a closure element 5' for the exhaust gas system 1 is arranged in parallel to the second bypass 1" in the exhaust gas system 1.

The closure elements 5, 5' can be controlled by way of a control unit 6, for example, a control unit of an internal combustion engine, preferably as a function of the operating point of the internal combustion engine, by use of a characteristic map. Whereas the hot sides of the thermoelectric power generators 3, 4 are arranged on the exhaust gas system 1 and can be heated by the exhaust gas of the internal combustion engine 2, the cold sides of the thermoelectric power generators 3, 4 in the present embodiment are operatively connected to a coolant circuit 7. The coolant circuit 7 has a coolant pump 8 for conveying coolant and two heat exchangers 9 for cooling the coolant.

Each thermoelectric power generator 3, 4 has between its hot side and its cold side a heat exchanger having a defined thermal conductivity. The thermal conductivity of the thermoelectric power generator 3 that is located in close proximity to the internal combustion engine 2 is less than that of the heat exchanger of the second thermoelectric power generator 4. Owing to the inventive configuration of the exhaust gas system 1, the first thermoelectric power generator 3 is driven with an exhaust gas that is hotter than that of the second thermoelectric power generator 4. Due to the varying thermal conductivities of the heat exchangers, the effect, that is, the cooling of the exhaust gas over the length of the exhaust gas system 1, is compensated, thus significantly increasing the efficiency for the recovery of electric power of the whole arrangement.

If the exhaust gas becomes too hot at certain operating points of the internal combustion engine 2, then the closure element 5 is closed downstream of the first thermoelectric power generator 3, so that an overheating is absolutely ruled out. At this point, the hot exhaust gas is conveyed only through the second thermoelectric power generator 4, which can still be used to its full capacity since the exhaust gas has cooled down in the interim. If the speed and/or the load of the internal combustion engine is (are) raised even more, then the exhaust gas mass flow through the second thermoelectric power generator 4 can also be switched off with the closure element 5 downstream of the second thermoelectric power generator 4. Consequently, both thermoelectric power generators 3, 4 are reliably protected from overheating. With the closure element 5' in the exhaust gas system 1, the entire exhaust gas mass flow can be passed in an advantageous way through the thermoelectric power generators 3, 4 for the fastest possible temperature rise in order to generate electric power.

Additional embodiments can provide even more thermoelectric power generators in additional bypasses, which in turn have heat exchangers exhibiting different thermal conductivities. It is also possible under certain conditions to dispense with the coolant circuit 7, if, for example, an air cooling system is provided. It is also possible to reduce the two heat exchangers 9 to a single large heat exchanger or several smaller heat exchangers. Moreover, the exhaust gas purification systems 10 in other embodiments can be integrated at other locations in the exhaust gas system 1.

In additional embodiments, the arrangement of the closure elements 5, 5' can also be configured in such a manner that they are arranged, for example, upstream of the thermoelectric power generators 3, 4 in the direction of flow of the exhaust gas. Some examples of closure elements 5, 5' that may be used are exhaust gas flaps or rotary slide valves. Preferably the exhaust gas system 1 and the bypasses 1', 1" exhibit the same exhaust gas flow cross section in order to minimize the flow losses.

Figure 2:
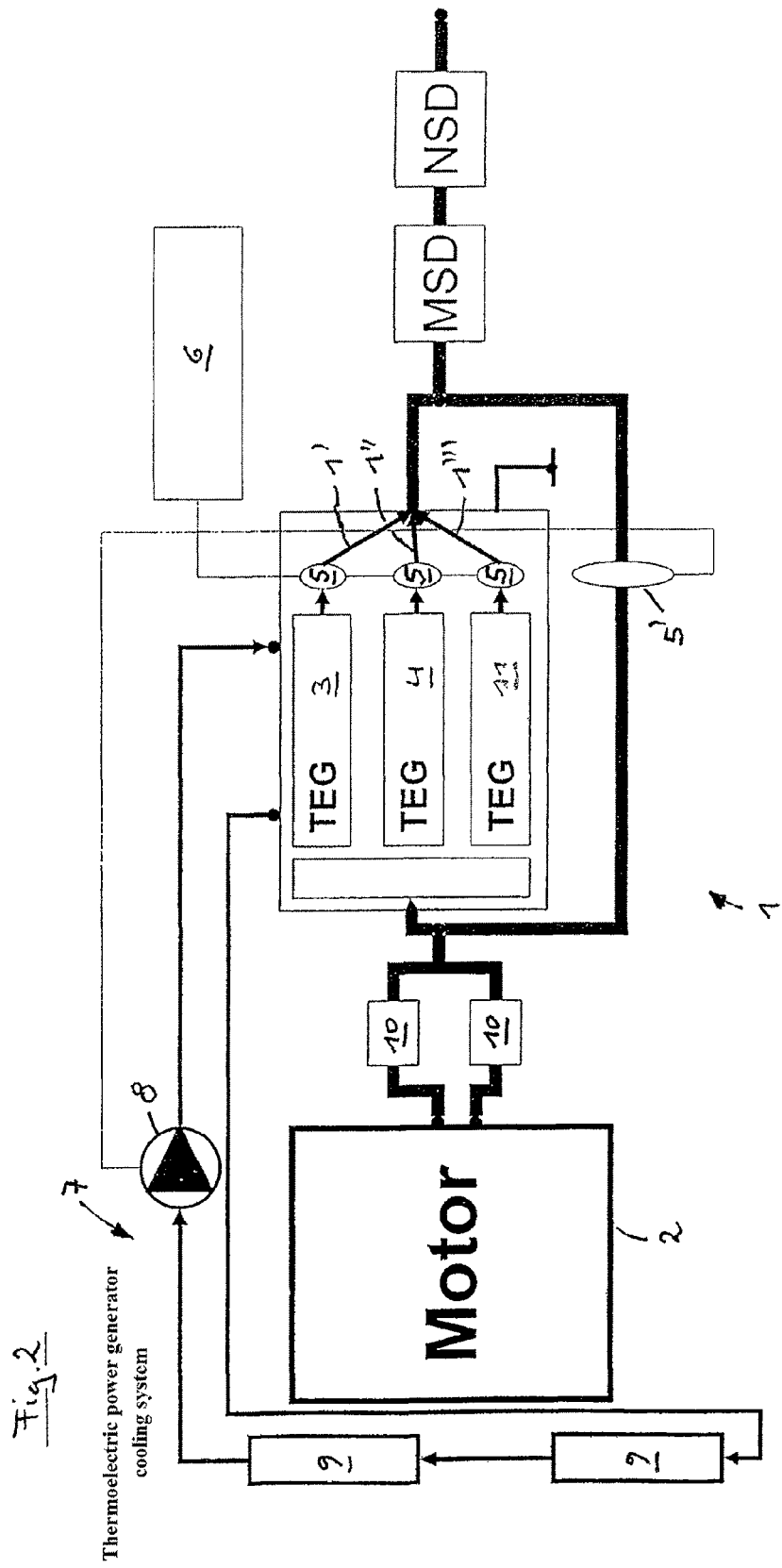
FIG. 2 is a schematic diagram of a second inventive embodiment for an exhaust gas system for an internal combustion engine.

FIG. 2 is a schematic diagram of a second especially preferred embodiment of an inventive exhaust gas system 1 for the internal combustion engine 2. The second especially preferred embodiment differs from the first especially preferred embodiment in FIG. 1 in that the thermoelectric power generators 3, 4, 11 (three thermoelectric power generators are used in this embodiment) are arranged in parallel to each other in a single, bifurcated bypass 1'". As in the case of the first especially preferred embodiment, in the second especially preferred embodiment, the thermoelectric power generators 3, 4, 11 also have heat exchangers exhibiting different thermal conductivities. Consequently, the exhaust gas can be conveyed to one or also two or, if the closure element 5' is closed in the exhaust gas system 1, also through all three thermoelectric power generators 3, 4, 11, by use of the closure elements 5, which are arranged downstream of the thermoelectric power generators 3, 4, 11 in the direction of flow of the exhaust gas, according to the operating state of the internal combustion engine, that is, as a function of the speed and/or of the demanded torque, thus according to the exhaust gas temperature. Should the exhaust gas become too hot due to a high load or speed owing to the operating state of the internal combustion engine, so that at least one thermoelectric power generator 3, 4, 11 could be destroyed by the heat, the closure elements 5 can be completely closed. Then the hot exhaust gas flows only through the exhaust gas line 1, as described in conjunction with the first embodiment. Consequently, the thermal destruction of the thermoelectric power generators 3, 4, 11 is absolutely ruled out. Furthermore, all of the aforesaid with respect to the first especially preferred embodiment also applies to the second especially preferred embodiment.

A practical arrangement of the second especially preferred embodiment could be as follows, for example:

First TEG 3: Very aggressive hot gas heat exchanger (for example, high rib density), maximum power output of the thermoelectric power generator 3 in a range between 30 and 70 km/h of a vehicle equipped with the exhaust gas system 1.

Second TEG 4: Power output of the hot gas heat exchanger is reduced compared to stage 1 (for example, reduced rib density, rib type), maximum power output of the thermoelectric power generator in a range between 70 and 130 km/h of the vehicle equipped with the exhaust gas system 1.

Third TEG 11: Very weak hot gas heat exchanger, maximum power output of the thermoelectric power generator in a range between 130 and 180 km/h of the vehicle equipped with the exhaust gas system 1.

On the whole, the inventive designs of the exhaust gas system 1 offer the following advantages:

(a) Spectrum of use that is significantly wider than that of a single stage TEG.

(b) Owing to an optimized low temperature TEG (heat exchanger having a very good thermal conductivity) also use in city traffic and/or at low load phases (speed range between approximately 30 and approximately 70 km/h).

(c) Owing to an optimized high temperature TEG (heat exchanger having a very low thermal conductivity) thermal recuperation even at relatively high speeds possible, no overload of the thermoelectric material, no back pressure problem due to a weak hot gas heat exchanger (speed range between approximately 130 and approximately 180 km/h).

(d) Optimization of the thermoelectric power generator in mid speed range (speed range between approximately 70 and approximately 130 km/h) with the goal of achieving an optimal total utility in the speed window that is driven the most.

TABLE OF REFERENCE NUMERALS 1. exhaust gas system
1' first bypass
1" second bypass
1''' third bypass
2. internal combustion engine
3. first TEG
4. second TEG
5. closure element
5' closure element exhaust gas system
6. control unit
7. coolant circuit
8. coolant pump
9. heat exchanger
10. exhaust gas purification system
11. third TEG The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An exhaust gas system for an internal combustion engine, comprising:
   a first thermoelectric power generator having a first heat exchanger with a first thermal conductivity, the first thermoelectric power generator having a hot side and a cold side with the hot side being arrangeable on the exhaust gas system so as to be heatable by exhaust gas of the internal combustion engine, wherein the first heat exchanger is arranged between the hot side and the exhaust gas flow;
   a least a second thermoelectric power generator having a second heat exchanger with a second thermal conductivity different from the first thermal conductivity of the first heat exchanger, the second thermoelectric power generator being arrangeable on the exhaust gas system; and
   a first bypass and a second bypass, the first and second bypasses being arranged one after the other in an exhaust gas flow direction;
   at least one closure element for the exhaust gas arranged in at least one of the first bypass and the second bypass; and
   a controller,
   wherein
   the first thermoelectric power generator is arranged in the first bypass in the exhaust gas flow direction, and the second thermoelectric power generator is arranged in the second bypass, and
   the controller is configured to operate the closure element based on an indication of an energy content of the exhaust gas to optimize thermoelectric power generation while preventing overheating of the first and second thermoelectric power generators.

2. The exhaust gas system according to claim 1, wherein the first heat exchanger of the first thermoelectric power generator has a lower thermal conductivity than the second heat exchanger of the second thermoelectric power generator.

3. The exhaust gas system according to claim 1, wherein exhaust gas of the internal combustion engine exhibits a colder or hotter temperature as a function of an operating point; and
   wherein the closure element is switchable such that hotter exhaust gas is conveyed to the one of the first and second thermoelectric power generators having the respective first and second heat exchanger with a lower thermal conductivity than the other of said first and second heat exchangers.

4. The exhaust gas system according to claim 3, further comprising a control unit operatively configured to drive the closure element.

5. The exhaust gas system according to claim 1, further comprising a coolant circuit in which the cold side of the first and second thermoelectric power generators are integrated.

6. The exhaust gas system according to claim 2 further comprising a coolant circuit in which the cold side of the first and second thermoelectric power generators are integrated.

7. The exhaust gas system according to claim 3, further comprising a coolant circuit in which the cold side of the first and second thermoelectric power generators are integrated.

8. The exhaust gas system according to claim 2, further comprising an additional closure element, the additional closure element being controllable such that all exhaust gas flows through the first and second bypasses.

9. The exhaust gas system according to claim 3, further comprising an additional closure element, the additional closure element being controllable such that all exhaust gas flows through the first and second bypasses.

* * * * *